United States Patent [19]

Mentzer

[11] 4,411,361

[45] Oct. 25, 1983

[54] SUPPORTING STRIP FOR CAPACITOR CONNECTIONS, STRIP PROVIDED WITH SUCH CONNECTIONS AND ITS USE FOR THE PRODUCTION OF CAPACITORS

[75] Inventor: Regis Mentzer, Bagnolet, France

[73] Assignee: L.C.C.-C.I.C.E.-Compagnie Europeenne de Composants Electroniques, Bagnolet, France

[21] Appl. No.: 374,897

[22] Filed: May 4, 1982

[30] Foreign Application Priority Data

May 8, 1981 [FR] France ............................ 81 09230

[51] Int. Cl.³ .......................................... B65D 73/02
[52] U.S. Cl. .................................. 206/329; 206/330; 206/338; 206/341; 206/480; 206/477; 206/820
[58] Field of Search ............. 206/328, 329, 330, 331, 206/336, 338, 341, 347, 480, 481, 482, 477, 495, 820, 44.11

[56] References Cited

U.S. PATENT DOCUMENTS

| | | | |
|---|---|---|---|
| 1,113,580 | 10/1914 | Sawyer | 206/341 |
| 1,213,455 | 1/1917 | Burke | 206/44.11 |
| 1,848,770 | 3/1932 | Davis et al. | 206/477 |
| 2,847,121 | 8/1958 | Neugebauer | 206/480 |
| 2,929,130 | 3/1960 | Packman | 206/331 |
| 3,048,268 | 8/1962 | Rocchi et al. | 206/330 |
| 3,091,835 | 6/1963 | Weiss | 206/328 |
| 3,822,783 | 7/1974 | Mortensen | 206/480 |
| 4,049,118 | 9/1977 | Honda et al. | 206/330 |
| 4,212,390 | 7/1980 | Raczkowski et al. | 206/341 |

FOREIGN PATENT DOCUMENTS

| | | | |
|---|---|---|---|
| 2109207 | 5/1972 | France | |
| 2364596 | 9/1977 | France | |
| 2046210 | 11/1980 | United Kingdom | 206/331 |

Primary Examiner—Joseph Man-Fu Moy
Assistant Examiner—David Fidei
Attorney, Agent, or Firm—Cushman, Darby & Cushman

[57] ABSTRACT

The invention relates to a supporting strip for connections for capacitors or the like, a strip provided with such connections and a process for fixing capacitors to such connections.

According to the invention, the connection supporting strip has series of upper and lower slots, which are respectively aligned with one another. Each upper slot is wider than the corresponding lower slot in such a way that the introduction of hairpin-like connections with a base shaped like a U located on the side of the upper slot brings about a progressive tightening of the ends of the arms of said connections.

This leads to an improvement of the fixing of clips or tabs for capacitors of the "paving stone" type prior to the welding and coating stages.

Application to the production of capacitors.

19 Claims, 6 Drawing Figures

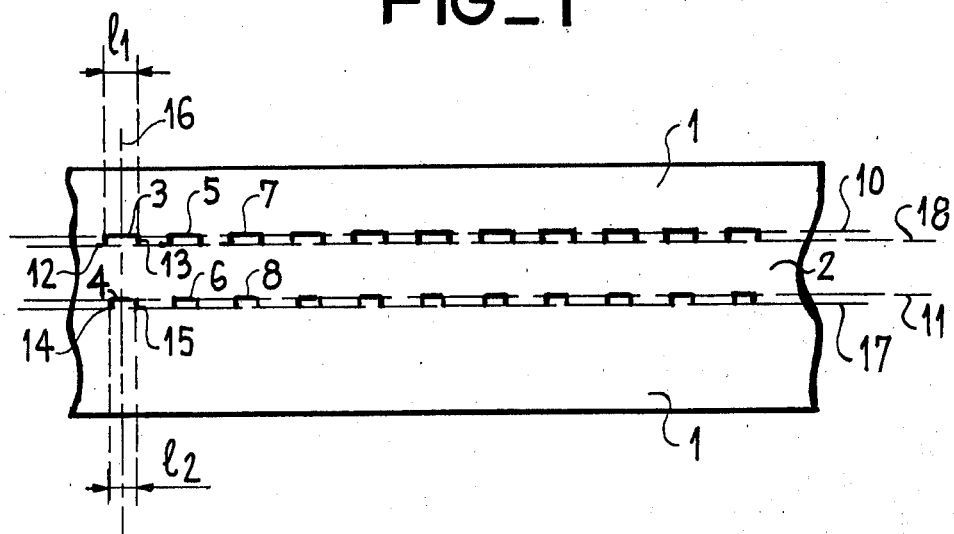
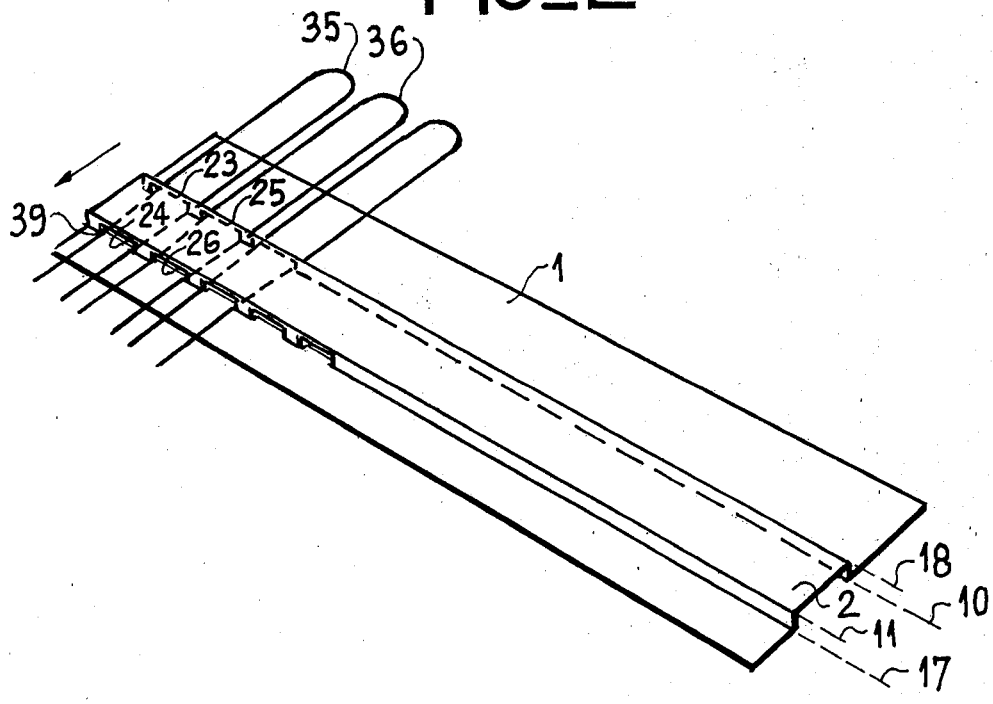

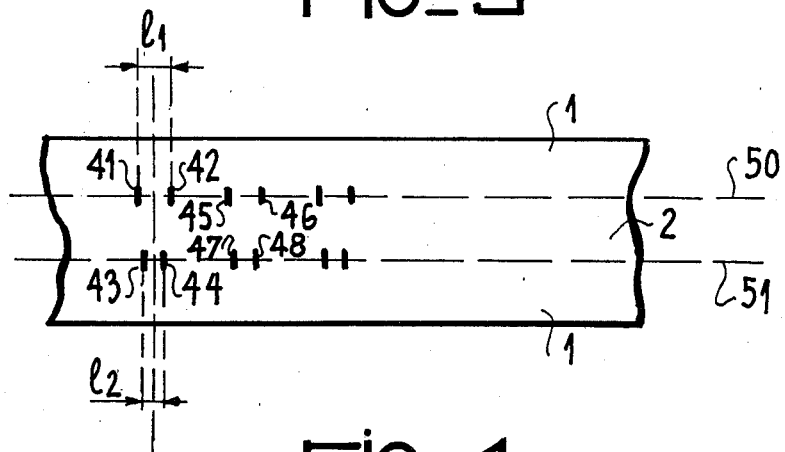
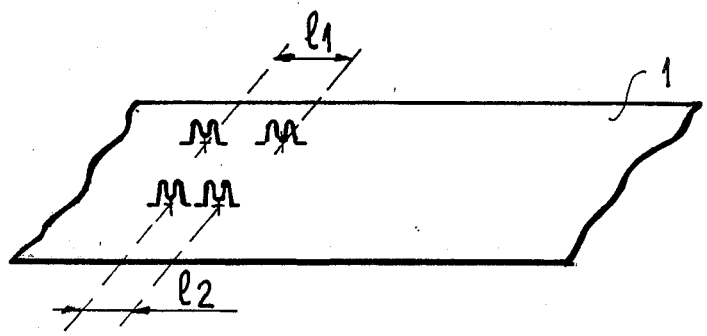
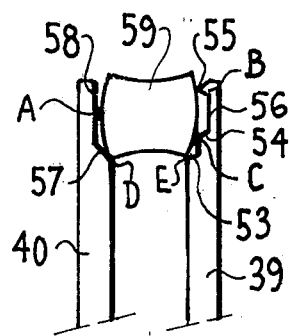
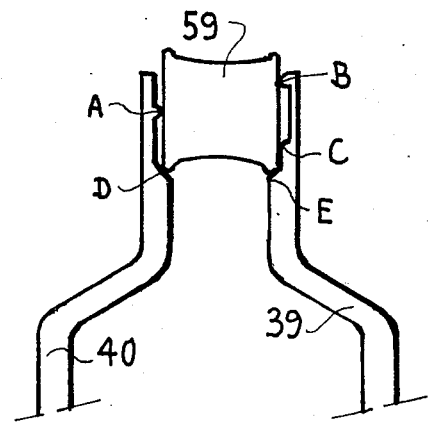

SUPPORTING STRIP FOR CAPACITOR CONNECTIONS, STRIP PROVIDED WITH SUCH CONNECTIONS AND ITS USE FOR THE PRODUCTION OF CAPACITORS

BACKGROUND OF THE INVENTION

The present invention relates to a supporting strip for the connections of capacitors or the like, a strip provided with such connections and its use for the production of capacitors.

It more specifically relates to a capacitor connection supporting strip provided with a flat support having pairs of slots regularly distributed along the support, each pair of slots being formed by an upper slot and a lower slot, which serve to receive the hairpin-shaped connections, whose two lateral arms positively traverse the same, whereby each capacitor is fixed between the two arms of the hairpin and substantially at the end thereof. This procedure for fixing capacitors by means of a strip provided with such hairpin-like members is used particularly widely in the production of flat capacitors and specifically those of the "paving block" type. Thus, when producing e.g. ceramic capacitors constituted solely by two metal foils separated by a dielectric material, the hairpin-like connections are positioned on each metal part of the disk. In this case, it is consequently necessary to bend these connections in order to respectively bring them above and below the disk. When the two connections are interconnected to form such a hairpin-like member, they exert a reaction on one another leading to a clamping of the disk so as to maintain it between the two arms of the pin, thereby permitting easy manipulation or handling during the following production stages of such capacitors. However, there can still be a problem of the disk pivoting between the two arms unless certain precautions are taken. To solve this problem, the hairpin-like member can be shaped in such a way that the forces applied by the arms are in the same plane. There can also be a bending of the arms below the disk in order to prevent such a pivoting action.

However, the problem is different in the case of multilayer capacitors. Thus, in this case, the metal coatings on which the arms of the hairpin-like member must bear are no longer disposed on the upper and lower faces of the capacitor and are instead positioned laterally. These connections, generally produced by metal spraying, are therefore of limited thickness and surface area and are positioned laterally with respect to the said upper and lower faces of the capacitor.

Therefore, the hairpins used are positioned in such a way that each of the arms thereof comes into contact with the said surfaces of the connections or sprayed coatings. When the physical contact is established between the end of the arms and the connections, mechanical and electrical assembly thereof generally takes place by immersion in a liquid solder bath. This operation causes two problems, which are especially difficult to solve. The first problem is that of maintaining a sufficient application force of the arms on the electrical connections to prevent the "paving stone" from disengaging from the arms during the insertion and removal of the capacitor with respect to the solder bath. The second problem is to prevent the rotation of the arms with respect to the capacitor during the same operations, whereby in both cases the thus produced capacitors cannot then be used.

As in the case of disk-type ceramic capacitors, it has already been proposed in the case of multilayer capacitors to effect a bending, curving or cambering of the arms of the hairpin-like member in order to bring about a gripping or clamping of the "paving stone" and consequently obviate the aforementioned problems. However, such a solution has a certain number of disadvantages. Thus, the production process for such capacitors involves a supplementary stage during which the arms are bent to give the hairpin its clamping action. Bearing in mind the extremely low cost of such capacitors, such a supplementary stage has a possibly determinative effect on the production price thereof, which must be reduced to maximum.

BRIEF SUMMARY OF THE INVENTION

To this end, the connection supporting strip according to the invention is characterized in that the upper slot is wider than the lower slot, so that with the hairpin-like member being inserted with the bottom of the U located on the side of the upper slot, the penetration of the arms into the upper and lower slots brings about the progressive tightening thereof.

This leads to a particularly simple solution of the aforementioned problems. Thus, during the production stage of the said capacitors during which the hairpin-like member is advanced so that the arms and the lateral connections of the "paving stone" are brought into proximity with one another, the movement of the pin on the strip leads to a progressive and continuous tightening thereof, so that the paving stone is clamped onto its lateral connections. In this way, it is easily possible to regulate the clamping force by the degree of penetration of the pin into the slots. In general, the penetration of the pin into the slots is of a predetermined length so as to match to known automatic machines, so that the respective widths of the slots and their relative position are regulated so as to obtain the desired result, as a function of the nature of the materials used.

Preferably, each upper slot is positioned substantially above the corresponding lower slot and substantially parallel to the edge of the supporting strip. According to a preferred embodiment, each slot is in the form of a U, whose branches are disposed parallel to one another, whereby the branches of each of the said slots are preferably directed from the upper slot towards the lower slot.

The ratio between the width of the upper slot and that of the lower slot is obviously dependent on the type of capacitors produced and also of the type of the hairpin used. Generally, the difference in the widths between the upper slot and the lower slot varies between 0.05 mm and 5 mm and preferably between 0.1 mm and 1 mm for a distance between said two slots of 15 mm. The latter can vary between 5 and 30 mm, the difference in the widths then varying in proportion thereto. However, in all cases the respective widths of the upper and lower slots are below or equal to the distance separating the arms of the hairpin-like member, when they are brought parallel to one another.

In order to permit each hairpin-like member to be used on the same means, the upper and lower slots are respectively aligned. However, it is possible to bring about a reciprocal displacement of the groups of upper and lower slots.

In the same way, the ends of the arms of each respectively upper and lower slot are generally aligned with one another. Thus, and particularly when the slots are U-shaped, the strip can be bent along the ends of the U-shaped arms, thus defining a cavity, whose height is substantially equal to the height of the arms. The height of this cavity is generally roughly the same as the thickness of the arms of the hairpin-like member in order to permit an easy displacement thereof in the slots. However, the U-shaped slots whose arms are directed from the upper slot towards the lower slot have the advantage that the portion of the supporting strip between the arms of the U having the shape of a tongue acts as a spacer between the said arms, thereby always maintaining a maximum spacing between them and preventing the hairpin-like member from sliding outside the strip. In order to still further improve this result, the lower U-shaped slot has a width which is slightly less than the diameter of the arms of the hairpin, thus exercising a braking function.

The slots made in the strip according to the invention can obviously have different configurations. They can be continuous and U-shaped, as described hereinbefore. However, the slots can also be constituted by a plurality of secondary slots, of which there are generally two. The size of each secondary slot is roughly the same as that of the arms of the connections in the form of hairpins. In the case of cylindrical arms, which obviously constitutes the most general cases, these secondary slots can be in the form of holes with a diameter close to that of the diameter of the arms. The distance between these two holes does not exceed the distance separating the branches of the hairpin-like member, when they are placed parallel to one another. However, the distance between two secondary slots forming the lower slot is less than this value. If this were not the case, stresses would occur on the arms of the said hairpins, which would be prejudicial to the correct operation thereof. It is also obvious that the distance between the two upper secondary slots is greater than that between the two lower secondary slots.

Another possible variant of the slots is to provide a plurality and preferably two secondary slots projecting over the strip and also having an approximately U-shaped configuration. In this way, the corresponding arm of the hairpin engages in the U and it is merely necessary to provide a sufficient spacing between the arms of said U to permit a translation movement of the arm of the corresponding hairpin. The projecting secondary slots are separated by a distance equal to or less than that separating the two arms of the hairpin when the latter are arranged parallel to one another, for the same reasons as indicated hereinbefore.

Thus, the strips provided with the hairpin-like members of the type described hereinbefore make it possible to improve the production processes for capacitors, particularly stacked capacitors, thereby eliminating one stage of said process. However, it has been found that in practice, parallelepipedic capacitors have not completely planar lateral faces on which the connections are to be made. This leads to the possibility of capacitors rotating during the welding process. Thus, according to a preferred embodiment of the invention, the end of the arms of said hairpin-like members is provided with means for fixing a capacitor. These means can be constituted in per se known manner by the bending of the clips or tabs in order to bring about a better contact between the group of two clips and the capacitor.

A particularly advantageous production procedure consists of flattening the end of the arms so as to form a flat, which increases the contacting surface between the said arms and the lateral connection zones of the capacitor. However, the most advantageous solution consists of then forming on the group of two flats at least three bosses, so as to prevent rotation during welding. Thus, provided that the champing force of the hairpin-like member is adequate, in such a case the bosses very slightly penetrate the lateral connections, thereby bringing about a mechanical anchoring of the connecting clips on the capacitor. Obviously, the number of bosses is not limited, but bearing in mind the size of the capacitors produced, preference is generally given to the use of no more than five bosses and three bosses give completely satisfactory results. However, it is possible to replace one or two bosses by the lower edge of the flat forming an inclined bearing surface. In this case, the flat must obviously be produced on the inner face of the end of the corresponding arm of the hairpin-like member, in order to produce a small ledge in the vicinity of its base and on which bears the capacitor. This solution can be adopted for the two arms of the hairpin-like member and under these conditions it is merely necessary to have one boss, e.g. in the vicinity of the end of one of the flat. Depending on the type of capacitor produced and the type of material used, the Expert will determine the most appropriate solution for this problem on the basis of simple routine tests. It is also obvious that at least one of the bosses can be carried by the actual capacitor. Thus, particularly when the capacitors have a very rounded lateral face, the latter can serve as a boss. In this case, the corresponding arm of the hairpin will be simply flattened and optionally curved, so as to follow the curvature of the boss carried by the capacitor.

BRIEF DESCRIPTION OF THE DRAWINGS

The invention is described in greater detail hereinafter relative to non-limitative embodiments and the attached drawings, wherein:

FIG. 1 is a plan view of a supporting strip of flattened connections provided with a plurality of U-shaped slots.

FIG. 2 shows the strip of FIG. 1 after bending and insertion of the hairpin-like members.

FIG. 3 is a variant of the slots disposed on the supporting strip.

FIG. 4 is a second variant of said slots.

FIG. 5 is a section view of a capacitor laterally secured by the arms of a hairpin-like member.

FIG. 6 is another variant of FIG. 5 in which the arms of the hairpin-like member have been bent.

DETAILED DESCRIPTION OF THE PREFERRED EMBODIMENTS

FIG. 1 shows an embodiment of a supporting strip according to the invention comprising a lateral part 1 and a central part 2 positioned between slots 3, 4, 5 and 6, 7, 8, etc. The slots 3, 5, 7, etc have a respective width $l_1$, while slots 4, 6, 8, etc have a respective width $l_2$. These series of upper slots 3, 5, 7, etc and lower slots 4, 6, 8, etc are respectively aligned on lines 10 and 11. Each of the slots is in the form of a U, whose arms are directed towards the bottom of the drawing. For example, slot 3 has two lateral arms 12 and 13 with the same length, while slot 4 has two lateral arms 14 and 15 of the same length, which is the same as that for slot 3. The upper and lower slots are arranged symmetrically with respect to a vertical axis, such as axis 16 for slots 3 and 4. The width $l_1$ of upper slot 3 exceeds the width $l_2$ of lower slot 4. As indicated hereinbefore, the respective dimensions $l_1$ and $l_2$, as well as the distance between 10 and 11 depend on the particular case and on the particular machines used. Generally, it is desirable not to have a too rapid convergence of the arms of the hairpin-like members during use. Therefore, the dimensions of $l_1$ and $l_2$ are relatively close to one another, $l_2$ being of course less than $l_1$. The ends of the arms of the slots of the upper row and slots of the lower row are respectively aligned essentially along lines 18 and 17. In order to facilitate the insertion of the hairpins, the card such as that shown in FIG. 1 is bent along lines 10, 18, 11, 17. The thus obtained card consequently has a central relief 2, like that shown in FIG. 2 which is a perspective view of the card carrying a plurality of hairpin-like members. In FIG. 2, the same elements as in FIG. 1 are denoted by the same reference numerals. After bending along lines 10, 18, 11, 17, tongues 23, 24, 25, 26, etc are formed. Tongues 23 and 25 are located in plane 2, while tongues 24 and 26 are located in plane 1. The hairpin-like members, such as 35 and 36 are introduced in the manner shown in FIG. 2 with the ends of the arms located on the side of lines 11 and 17. The tongues 24 and 26 level with plane 1 also constitute spacing means for the arms of said pins. Of course, the width of tongues 24, 26 is less than that of tongues 23, 25, thus bringing about the tightening of the ends of the arms of pins 35, 36, during their translation in the direction indicated by the arrow in FIG. 2.

FIG. 3 shows a first constructional variant of the guidance means of the arms of pins such as 35 and 36 in order to ensure the tightening thereof. These guidance means are, in FIG. 3, merely constituted by holes with a diameter greater than that of the diameter of the pins in order to facilitate the penetration of the latter. Holes 41, 42, 45, 46, etc are substantially aligned on hole 50, whilst lower holes 43, 44, 47, 48, etc are substantially aligned on line 51. Holes 41 and 42, 45 and 46, etc are spaced by $l_1$, whilst holes 43 and 44, 47 and 48, etc are spaced by $l_2$, the latter being less than the former. Preferably, these holes are arranged substantially symmetrically, holes 41, 42, 43, 44 are arranged symmetrically with respect to the vertical axis 52.

FIG. 4 shows a second variant of the guidance means enabling the obtaining of the effect according to the invention. In this case, the guidance means are constituted by slots projecting over supporting strip 1. These slots have an inner groove with a diameter substantially equal to that of the hairpins such as 35 and 36. The groove is also extended by two arms which are made tighter, so that pins 35 and 36 are not disengaged from support 1 during handling. Obviously, further variants can be envisioned by the Expert.

FIG. 5 shows the ends of a hairpin-like member such as 35, 36 having a special configuration. In FIG. 5, the same elements as in the previous drawings carry the same references. Arms 39, 40 of the hairpin-like member respectively end with a bearing surface 53, a boss 54 and a boss 55 connected to the aforementioned by a vertical bearing surface 56, while the end of arm 40 is terminated by a sloping land 57 and a vertical land 58. The contacts between the capacitor 59 and the ends of these arms are respectively formed at points A, B, C, D and E. Capacitor 59 consequently bears on two inclined lands 53, 57, while the two bosses 54, 55 prevent any rotation of the capacitor in a plane perpendicular to the plane of the drawing. Obviously, a large number of variants can be envisaged for these ends. However, it is essential that in all cases there are at least three contact points between the two branches and the lateral connections of capacitor 59. In particular, bearing surfaces D and E are not necessary, although they greatly facilitate the operations. In this case, arm 40, e.g. at point A, is provided with a boss in order to improve the anchoring of the arm and of the lateral connection of capacitor 59.

The ends of arms 39 and 40 are generally produced by flattening the end, so as to form two inclined bearing surfaces D and E towards the interior of the hairpin-like member.

FIG. 6 is a variant of FIG. 5 in which the capacitor 59 has a more rectangular shape than in FIG. 5. Clips 39 and 40 are bent so as to provide the spacing required by the user.

The supporting strips provided with hairpin-like members, of the type described hereinbefore, are used in the same way as the known commercially available supporting strips. By the movement of the pins in the direction of the arrow (see FIG. 2), the ends of the arms are tightened and thus secure the capacitors such as 59 on their lateral connections. The presence of at least three contact points on the two arms, namely at A, B and C prevents any disengagement of the capacitor from the clips or any rotation thereof during the following production operation, which would in either case make the thus produced capacitors unusable.

The invention is obviously not limited to capacitors, the latter term serving to designate any type of component requiring a connection by gripping, clamping and/or welding on two opposite faces thereof.

What is claimed is:

1. A supporting strip to aid in the production of electrical components of the type having a hairpin connector having terminal ends between which the electrical component is grippingly engaged during production thereof, said supporting strip comprising a support member including means defining plural paired upper and lower openings each for receiving a respective one of said hairpin connectors therein in such a manner that said terminal ends are disposed beside their respective lower openings, said paired openings being longitudinally spaced apart relative to adjacent ones thereof along said support member, each of said upper openings including means defining first opposing edge surfaces separated from one another by a first predetermined dimension, and each of said lower openings including means defining second opposing edge surfaces separated from one another by a second predetermined dimension less than said first dimension, said first and second edge surface defining means for convergingly displacing said terminal ends relative to one another as said hairpin connector is advanced through its respective paired upper and lower openings in a direction of movement from said upper opening to said lower opening to increase the gripping engagement exerted by said terminal ends upon said electrical component.

2. A supporting strip as in claim 1 wherein each of said upper and lower openings includes means defining a pair of longitudinally spaced apart slots.

3. A supporting strip as in claim 1 wherein each of said upper and lower openings are defined by means of paired projecting portions fixed to said supporting strip at predetermined longitudinally spaced apart locations along said strip.

4. A supporting strip as in claim 1 wherein each of said upper and lower openings is an elongated slot arranged substantially parallel to the edge of the supporting strip.

5. A supporting strip as in claim 1 wherein each of said upper and lower openings is in the form of a U-shaped slot at least partially defined by opposing arms positioned substantially parallel to one another.

6. A supporting strip as in claim 5 wherein the arms of said U-shaped slot are downwardly directed.

7. A supporting strip as in claim 1 wherein the proportional difference between said first and second dimensions varies between 0.1 and 1.0 mm for a distance of 15 mm between each of the openings.

8. A supporting strip as in claim 5 wherein each pair of upper and lower slots is longitudinally aligned.

9. A supporting strip as in claim 5 wherein the arms of each said upper slot and the arms of each said lower slot are substantially parallel to one another.

10. A supporting strip as in claim 5 or 9 wherein the strip is folded along parallel lines between each of the arms of said U-shaped slot to define a cavity having a height substantially equal to the height of the arms.

11. A supporting strip to aid in the production of electrical components comprising:
   plural hairpin connectors each having a pair of arms defining terminal ends and including means at the terminal ends of said arms for fixing an electrical component therebetween;
   a support member including means defining plural paired upper and lower openings, predetermined ones of said paired openings having one of said hairpin connectors respectively received therein in such a manner that said terminal ends are disposed beside their respective lower openings, said paired openings being longitudinally spaced apart relative to adjacent ones thereof along said support member, each of said upper openings including means defining first opposing edge surfaces separated from one another by a first predetermined dimension, and each of said lower openings including means defining second opposing edge surfaces separated from one another by a second predetermined dimension less than said first dimension, said first and second edge surface defining means for convergingly displacing said terminal ends relative to one another as said hairpin connectors are advanced through their respective paired upper and lower openings in a direction of movement from said upper opening to said lower opening to increase the gripping engagement exerted by said terminal ends upon said electrical component.

12. A supporting strip as in claim 1 further including at least one hairpin connector having a pair of arms disposed in a corresponding one of said paired upper and lower openings wherein the ends of the arms of said hairpin connector include fixing means for fixing an electrical component therebetween.

13. A supporting strip as in claim 12, 1 or 11 wherein the electrical component is a capacitor.

14. A supporting strip according to claim 12, wherein said fixing means includes means defining a bend in the hairpin connector.

15. A supporting strip according to claim 12 or 13, wherein the fixing means includes means defining a flat portion on each of the ends of the hairpin connector.

16. A supporting strip according to claim 15, wherein the flat portion includes at least three bosses.

17. A supporting strip according to claim 16, wherein each flat portion is positioned in such a way that there is a lower bearing surface directed towards the other arm on which the electrical component bears.

18. A supporting strip as in claim 11 wherein the respective said first and second dimensions of the upper and lower openings are less than or equal to the distance separating the arms of the hairpin connectors.

19. Use of a supporting strip according to claim 12 or 1 in the production of capacitors.